US009953699B2

(12) United States Patent
Ichihashi

(10) Patent No.: US 9,953,699 B2
(45) Date of Patent: Apr. 24, 2018

(54) STATIC RANDOM ACCESS MEMORY (SRAM) ASSIST CIRCUIT

(71) Applicant: GLOBALFOUNDRIES INC., Grand Cayman (KY)

(72) Inventor: Motoi Ichihashi, Sunnyvale (CA)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/204,473

(22) Filed: Jul. 7, 2016

(65) Prior Publication Data

US 2018/0012648 A1    Jan. 11, 2018

(51) Int. Cl.
G11C 11/00 (2006.01)
G11C 11/419 (2006.01)
G11C 11/418 (2006.01)

(52) U.S. Cl.
CPC .......... *G11C 11/419* (2013.01); *G11C 11/418* (2013.01)

(58) Field of Classification Search
CPC ..................................................... G11C 11/00
USPC ............................................................ 365/154
See application file for complete search history.

(56) References Cited

U.S. PATENT DOCUMENTS

| 7,701,755 B2 * | 4/2010 | Chen | G11C 11/412 |
| | | | 365/154 |
| 2008/0158939 A1 * | 7/2008 | Chen | G11C 11/413 |
| | | | 365/154 |

OTHER PUBLICATIONS

Yabuuchi et al., "16 nm FinFET High-k/Metal-gate 256-kbit 6T SRAM macros with Wordline Overdriven Assist", IEEE, 2014, 3 pages.
Zang et al., "A 3-GHz 70Mb SRAM in 65nm CMOS Technology with Integrated Column-Based Dynamic Power Supply", IEEE International Solid-State Circuits Conference, 2005, 3 pages.
Karl et al., "A 4.6GHz 162Mb SRAM Design in 22nm Tri-Gate CMOS Technology with Integrated Active VMIN-Enhancing Assist Circuitry", IEEE International Solid-State Circuits Conference, 2012, 3 pages.
Yamaoka et al., "90-nm Process-Variation Adaptive Embedded SRAM Modules With Power-Line-Floating Write Technique", IEEE, vol. 41, No. 3, Mar. 2006, 7 pages.
Nii et al., "A 45-nm Single-port and Dual-port SRAM family with Robust Read/Write Stabilizing Circuitry under DVFS Environment", IEEE, 2008, 2 pages.
Takeda et al., "Multi-step Word-line Control Technology in Hierarchical Cell Architecture for Scaled-down High-density SRAMs", IEEE, 2010, 2 pages.

* cited by examiner

*Primary Examiner* — Harry W Byrne
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to a static random access memory assist circuit and methods of implementation and manufacture. The structure includes at least one static random access memory (SRAM) cell and a read assist circuit structured to apply a negative voltage to the at least one SRAM cell upon asserting of a wordline of the at least one SRAM cell.

15 Claims, 7 Drawing Sheets

STATIC RANDOM ACCESS MEMORY (SRAM) ASSIST CIRCUIT

FIELD OF THE INVENTION

The present disclosure relates to semiconductor structures and, more particularly, to a static random access memory assist circuit and methods of implementation and manufacture.

BACKGROUND

Static random-access memory (SRAM) is type of semiconductor memory that uses bistable latching circuitry (flip-flop) to store each bit. SRAM exhibits data remanence, but it is still volatile in that data is eventually lost when the memory is not powered.

SRAM cells can include write and read assist circuitry. For example, a write assist circuit can include a wordline overdrive or boost. Another write assist circuit can include a floating or lowering of VDD. A read assist circuit can include a lowering of VDD or applying a multistep voltage (VDD) to the wordline. However, none of the read assist circuits provide improvement to both the read margin and read speed.

SUMMARY

In an aspect of the disclosure, a structure comprises at least one static random access memory (SRAM) cell and a read assist circuit structured to apply a negative voltage to the SRAM cell upon asserting of a wordline of the at least one SRAM cell.

In an aspect of the disclosure, an array of a static random access memory (SRAM) cells comprises: a plurality of SRAM cells arranged in rows; a wordline driver coupled to each SRAM cell for each row of SRAM cells, which is structured to assert a wordline; and a read assist circuit structured to apply a negative voltage to each SRAM cell in a row of SRAM cells which has synchronously asserted the wordline.

In an aspect of the disclosure, a method of assisting in read operations of at least one SRAM cell in an array of SRAM cells, comprises synchronously asserting a wordline of the at least one SRAM cell and providing a negative voltage to transistors of cross couple inverters of the at least one SRAM cell.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a static random access memory assist circuit and methods of implementation and manufacture. More specifically, the present disclosure relates to an SRAM assist circuit provided with negative VSS assist for read assist operations. Advantageously, the presently disclosed circuitry provides higher stability for read operations (SNM) and write operations (WRM), compared to conventional SRAM circuits. For example, the SRAM assist circuit described herein provides a larger read margin (SNM) without impacting the write margin (WRM), while also providing a larger Tread (read-out cell current) resulting in higher operational speeds compared to conventional circuits.

In embodiments, the SRAM assist circuit provides a lower operating voltage for an SRAM cell, compared to conventional circuits. For example, operating voltages can be, e.g., 0.8 V @ 14 nm, 0.75 V @ 10 nm and 0.7 V @ 7 nm. Moreover, by implementing the SRAM assist circuit described herein, higher performance beyond 10 nm technology can be achieved. Also, a large impact on operating performance can be achieved by providing a larger capacitance and resistance, as compared to conventional circuits. The SRAM assist circuit described herein can also be used with other conventional assist circuits, as described further herein.

Figure 1:
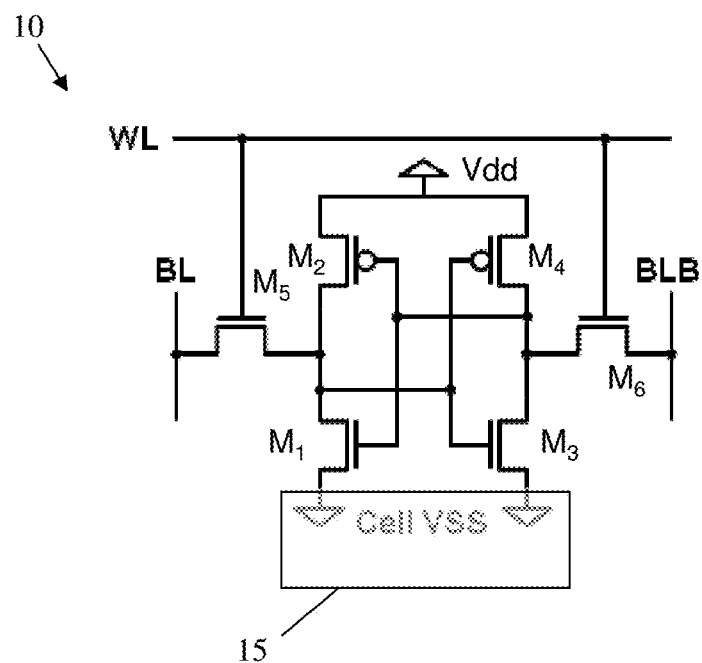
FIG. 1 shows a schematic of a static random access memory (SRAM) assist circuit in accordance with aspects of the present disclosure.

FIG. 1 shows a static random access memory (SRAM) assist circuit in accordance with aspects of the present disclosure. More specifically, the SRAM assist circuit 10 is a six transistor CMOS SRAM cell; although other configurations are also contemplated herein, e.g., 4T, 8T, 10T SRAM, etc. In embodiments, the SRAM cell 10 comprises six MOSFETs, $M_1$-$M_6$. In embodiments, each bit in the SRAM is stored on four transistors $M_1$, $M_2$, $M_3$, $M_4$ that form two cross-coupled inverters. The SRAM cell 10 has two stable states which are used to denote 0 and 1.

Still referring to FIG. 1, two access transistors $M_5$ and $M_6$ serve to control the access to a storage cell during read and write operations. For example, access to the SRAM cell 10 is enabled by the wordline WL which controls the two access transistors $M_5$ and $M_6$ which, in turn, control whether the SRAM cell 10 should be connected to the bit lines: BL and BLB. The bit lines BL and BLB are used to transfer data for both read and write operations. A power rail, e.g., cell VSS 15, provides a negative voltage source to the SRAM cell, e.g., couples a negative voltage to the cross coupled inverters, i.e., transistors $M_1$, $M_2$, $M_3$, $M_4$ and, more specifically, pull down transistors $M_1$ and $M_3$.

Figure 2:
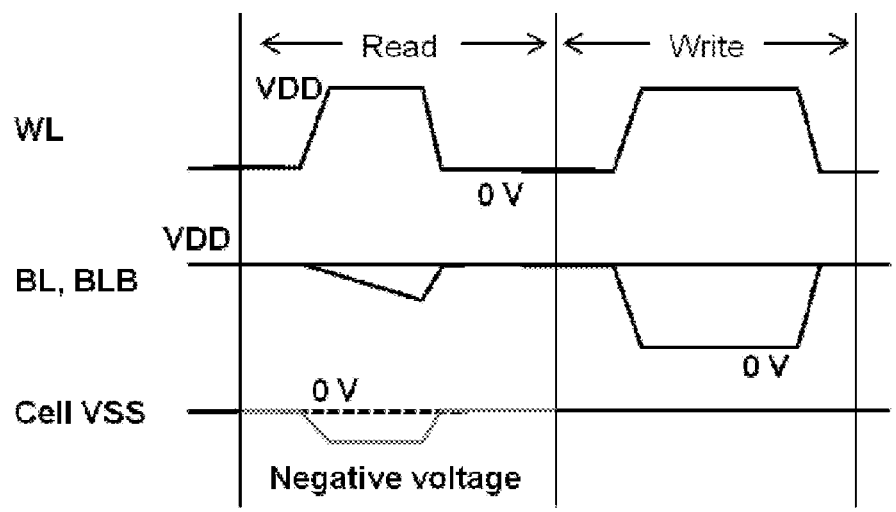
FIG. 2 shows read and write operations (cycles) of the SRAM assist circuit of FIG. 1 in accordance with aspects of the present disclosure.

Referring to both FIGS. 1 and 2, in embodiments, the SRAM cell 10 has three different states: standby (e.g., the SRAM cell is idle), reading (e.g., data has been requested) and writing (e.g., updating the contents). More specifically, in the standby mode, when the wordline WL is not asserted, the access transistors $M_5$ and $M_6$ disconnect the cell from the bit lines BL, BLB. The two cross-coupled inverters formed by transistors $M_1$-$M_4$ will continue to reinforce each other as long as they are connected to the supply, VDD.

During the read access cycle, on the other hand, synchronously with the asserting of the wordline WL, the cell VSS 15 will connect to a negative voltage, which is lower than ground (see, e.g., FIG. 2). By connecting the cell VSS 15 to a negative voltage, read margin and read speed is improved compared to a conventional SRAM cell. Moreover, when the negative voltage is supplied by an external port (e.g., cell VSS), it is possible to share that negative voltage for negative-BL scheme and also negative VSS to achieve the benefits of the SRAM cell as described herein.

Also, as in conventional SRAM cells, when the wordline WL is asserted (e.g., a voltage is applied to VDD), the bit lines BL, BLB can be actively driven high and low by the cross coupled inverters formed by transistors $M_1$-$M_4$. That is, by asserting the wordline WL, both the access transistors $M_5$ and $M_6$ are enabled which causes the bit line BL voltage to either slightly drop (e.g., NMOS transistor $M_3$ is ON and PMOS transistor $M_4$ is "OFF") or rise (e.g., PMOS transistor $M_4$ is "ON"). In embodiments, the read cycle can also be started by precharging both bit lines BL and BLB, i.e., driving the bit lines to a threshold voltage (midrange voltage between logical 1 and 0).

The write cycle begins by applying the value to be written to the bit lines BL, BLB. For example, to write "0", "0" would be applied to the bit lines, i.e., setting BL to 1 and BLB to 0. The wordline WL is then asserted (e.g., a voltage is applied to VDD), and the value that is to be stored is latched in. Also, VSS is connected to ground (see, e.g., FIG. 2). In practice, access NMOS transistors $M_5$ and $M_6$ have to be stronger than either NMOS transistors $M_1$, $M_3$ or PMOS transistors $M_2$, $M_4$. In embodiments, when one transistor pair (e.g. $M_3$ and $M_4$) is only slightly overridden by the write process, the gate voltage of the opposite transistors pair ($M_1$ and $M_2$) is also changed. This means that the $M_1$ and $M_2$ transistors can be easily overridden. Thus, the cross-coupled inverter will magnify the writing process.

Figure 3:
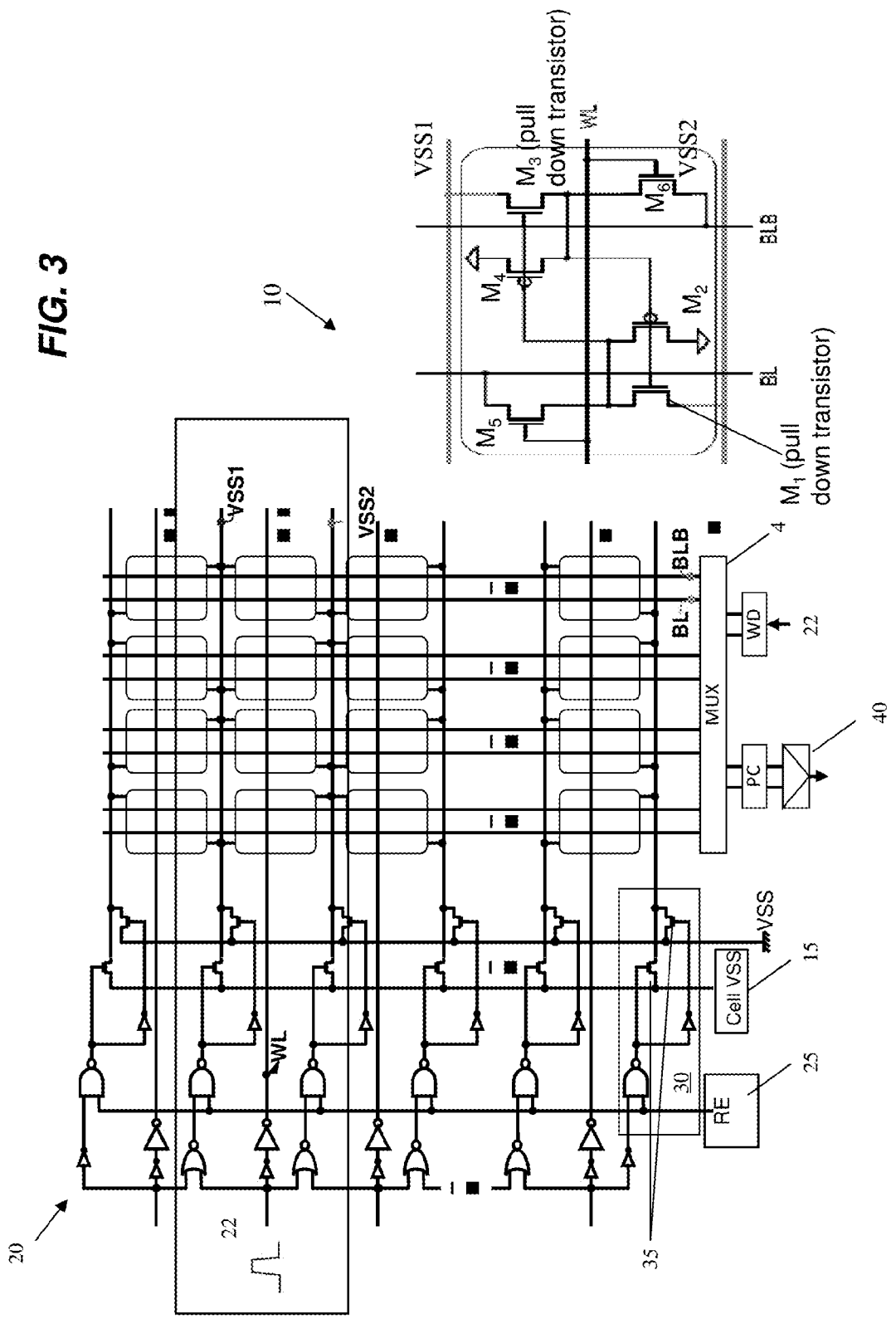
FIG. 3 shows an array of SRAM cells and related circuitry in accordance with aspects of the present disclosure.

FIG. 3 shows an array of SRAM cells with additional circuitry in accordance with aspects of the present disclosure. In FIG. 3, the array of SRAM cells 20 includes a plurality of SRAM cells 10 configured into respective rows and columns. In embodiments, the SRAM cells 10 are an equivalent SRAM cell as shown in, e.g., FIG. 1. More specifically, the SRAM cells 10 representatively shown in FIG. 3 comprises six MOSFETs, $M_1$-$M_6$, with four transistors $M_1$, $M_2$, $M_3$, $M_4$ forming two cross-coupled inverters and two additional access transistors $M_5$ and $M_6$ serving to control the access to a storage cell during read and write operations.

In embodiments, each row of SRAM cells 10 includes a wordline WL driver 22 and a respective node, e.g., VSS1, VSS2, etc., as shown representatively in box 100. A read enable circuit 25 is also shown, which acts as a switch for read and write operations. A sense amp 40 and MUX 45 can also be connected to the array of SRAM assist circuits 20. In embodiments, the sense amp 40 can be coupled to a precharge circuit, for precharging the bitlines BL, BLB. In embodiments, the sense amp 40 will read out data from the SRAM cell (circuit) 10.

As further shown in FIG. 3, the power rail, e.g., cell VSS 15, is coupled or applies a negative voltage to the cross coupled inverters, i.e., pull down transistors $M_1$ and $M_3$, via lines or nodes VSS1 and VSS2. The cell VSS 15 can be external or internal to the SRAM cell, e.g., array of SRAM cells 20. A plurality of circuits 30 are used to turn "ON" and "OFF" a respective FET 35 during a read or write operation, to connect the nodes VSS1, VSS2, etc. to either ground (VSS) or the negative voltage of cell VSS 15. In operation, as shown representatively in box 100, upon asserting (activating) the wordline driver 22, a negative voltage will be passed to each SRAM in the respect row (of the wordline driver 22) via lines or nodes VSS1, VSS2. By way of more specific explanation, the negative voltage applied by the power rail, e.g., cell VSS 15, will be provided to the pull down transistors, e.g., $M_1$ and $M_3$, of the SRAM cells in the row. During this operational stage, the remaining SRAM cells 10 will remain connected to ground, e.g., VSS.

Figure 4:
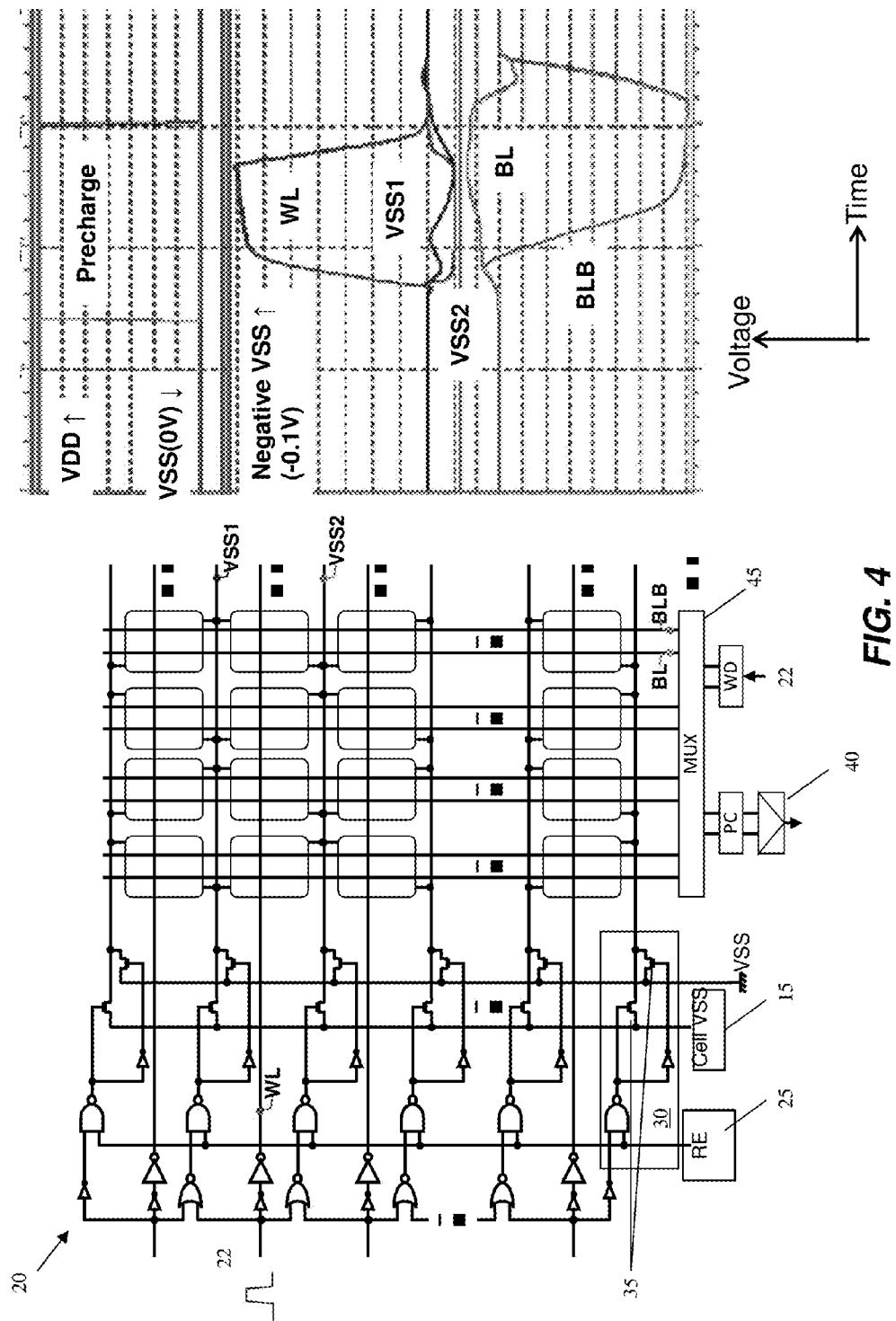
FIG. 4 shows a simulation waveform implementing the SRAM assist circuit in accordance with aspects of the present disclosure.

FIG. 4 shows a simulation waveform implementing the SRAM assist circuit in accordance with aspects of the present disclosure. As shown more specifically in the simulation waveform and accompanying array of SRAM cells 20, a negative voltage, e.g., −0.1 V (or −0.2 V) is applied to or by the cell VSS 15 during the read cycle. It should be understood that the negative voltage can also be other voltages, e.g., −0.3, −0.4, etc., and that the examples provided herein are provided for non-limited, illustrative purposes. In contrast, VSS is at ground (e.g., 0 V) during a write cycle. When the read enable circuit 25 is low, VSS1 and VSS2 stays at "0" as they are connected to VSS (ground). That is, upon assertion of the wordline WL, VSS1 and VSS2 are "0". On the other hand, during the read cycle, nodes VSS1 and VSS2 will be negative, e.g., −0.1V, as they will be connected to the cell VSS 15. And, even without overdrive, overall speed of the SRAM cell is increased, but without adding any parasitic capacitance.

Figure 5:
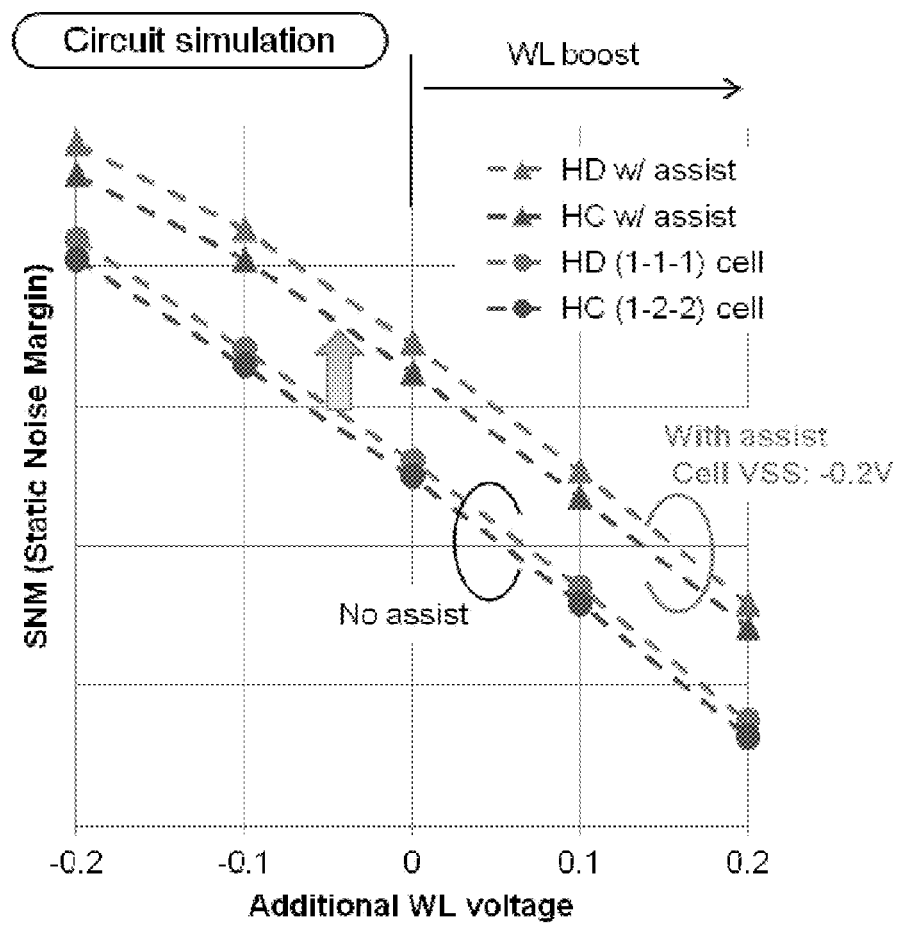
FIG. 5 shows a simulation of read margin evaluation for different SRAM cells including the SRAM assist circuit in accordance with aspects of the present disclosure.

FIG. 5 shows a simulation of read margin evaluation for different SRAM cells including the SRAM assist circuit in accordance with aspects of the present disclosure. More specifically, FIG. 5 shows three simulations: HD w/assist; HC w/assist; HD (1-1-1) cell; and HC (1-2-2) cell. As should be understood by those of ordinary skill in the art, the designation of 1-1-1 and 1-2-2 stands for the number of fins. Also, in embodiments, the fins are sequentially represented as PU-PG-PD (Pull up/Pass Gate(=WL transistor)/Pull down). Moreover, it should be understood by those of ordinary skill in the art that the present invention is not limited to a 1-1-1 or 1-2-2 configuration and that other configurations can also be implemented within the scheme described herein, e.g., 1-1-2, 1-3-3, 1-2-3, etc. The x-axis represents additional wordline WL voltage and the y-axis represents SNM (static noise margin) in a read operation.

As representatively shown in FIG. 5, both the HD w/assist and HC w/assist are implementing the SRAM cell with assist as described herein; whereas, both the HD (1-1-1) cell and HC (1-2-2) cell are conventional SRAM cells without implementing the assist circuit as described herein. As shown in the simulation, both the HD w/assist and HC w/assist show improved SNM over the entire range of additional wordline WL voltage, upon application of −0.2 V to the cell VSS 15. That is, the negative VSS scheme is effective even with boost from the wordline WL (e.g., a wordline boost that is higher than nominal voltage). Also, as should now be understood by those of skill in the art, the SRAM cell with assist, as described herein, provides a larger read margin which translates into improved stability. Also, it has been calculated that there is a larger voltage margin between the voltage Vx rising up in the left side of the inverter, e.g., transistors $M_1$, $M_2$, and the logic threshold voltage Vth on the right side of the inverter, e.g., transistors $M_3$, $M_4$.

Figure 6:
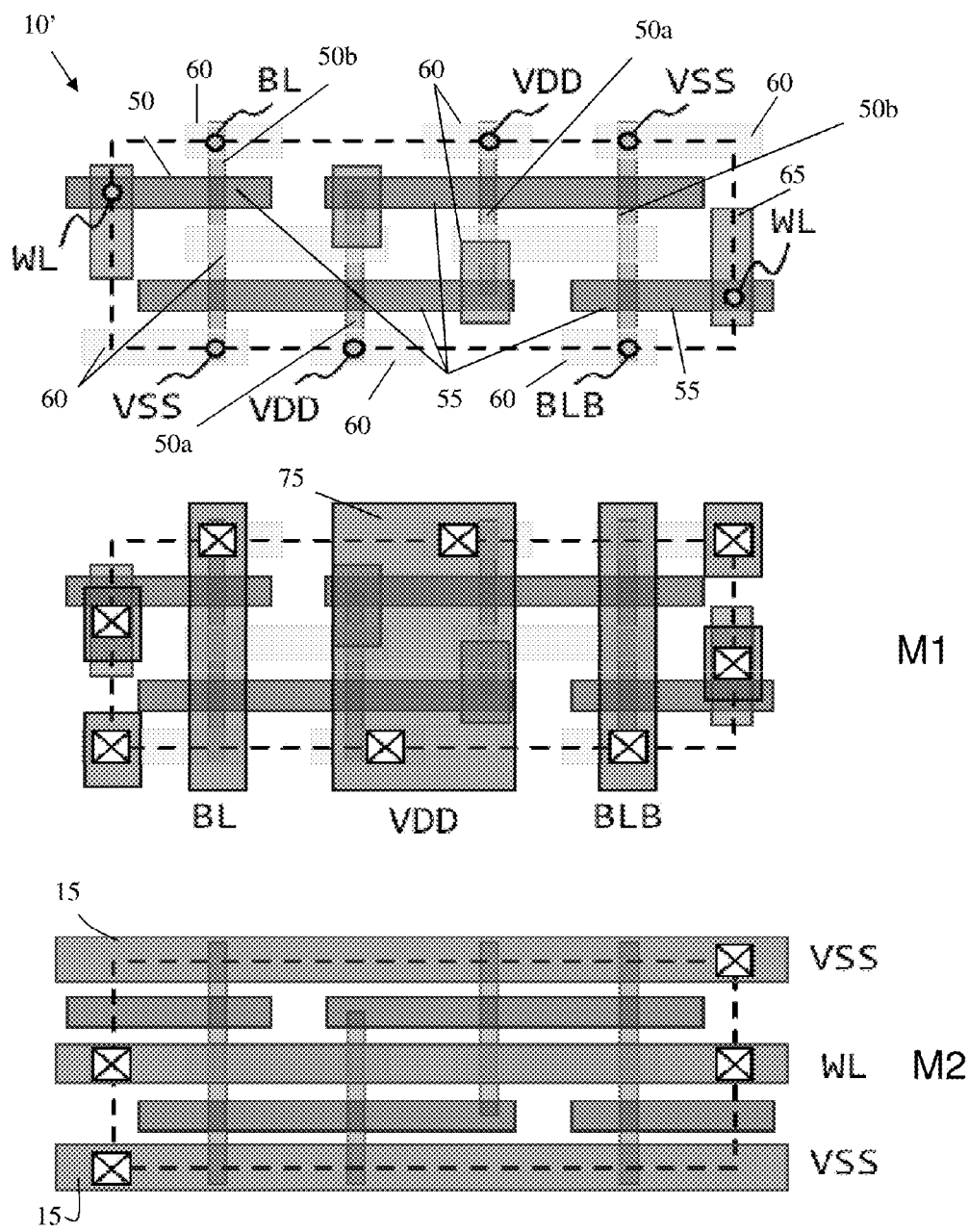
FIG. 6 shows a layout design of the SRAM assist circuit in accordance with aspects of the present disclosure.

FIG. 6 shows a layout design of the SRAM assist circuit, e.g., HD (1-1-1) cell, in accordance with aspects of the present disclosure. As shown representatively in FIG. 6, the layout design 10' includes a plurality of fins, e.g., P+ fins 50a and N+ fins 50b and plurality of gates 55 spanning over and/or between the P+ fins 50a and N+ fins 50b. The P+ fins 50a and N+ fins 50b are connected to features on other levels (e.g., M1, M2, etc.) by use of fin connections (contacts) 60. Similarly, the gates 55 are connected to features on other levels (e.g., M1, M2, etc.) by use of gate connections (contacts) 65. As shown in the M1 level, metal features 75 connect to the different features, e.g., wordline WL, supply voltage VDD, cell VSS, and bitlines BL, BLB, via the contacts 65, 70. As shown in the M2 level, in embodiments, the cell VSSs run in parallel to the wordlines WL.

The SRAM assist circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the SRAM assist circuit 10 of the present disclosure have been adopted from integrated circuit (IC) technology. For example, the structures are built on wafers and are realized in films of material patterned by photolithographic processes on the top of a wafer. In particular, the fabrication of the SRAM assist circuit uses three basic building blocks: (i) deposition of thin films of material on a substrate, (ii) applying a patterned mask on top of the films by photolithographic imaging, and (iii) etching the films selectively to the mask. In embodiments, the SRAM assist circuit is available for all nodes with FinFET technology as shown in the layout design of FIG. 6, or can be implemented with conventional bulk CMOS technology.

Figure 7:
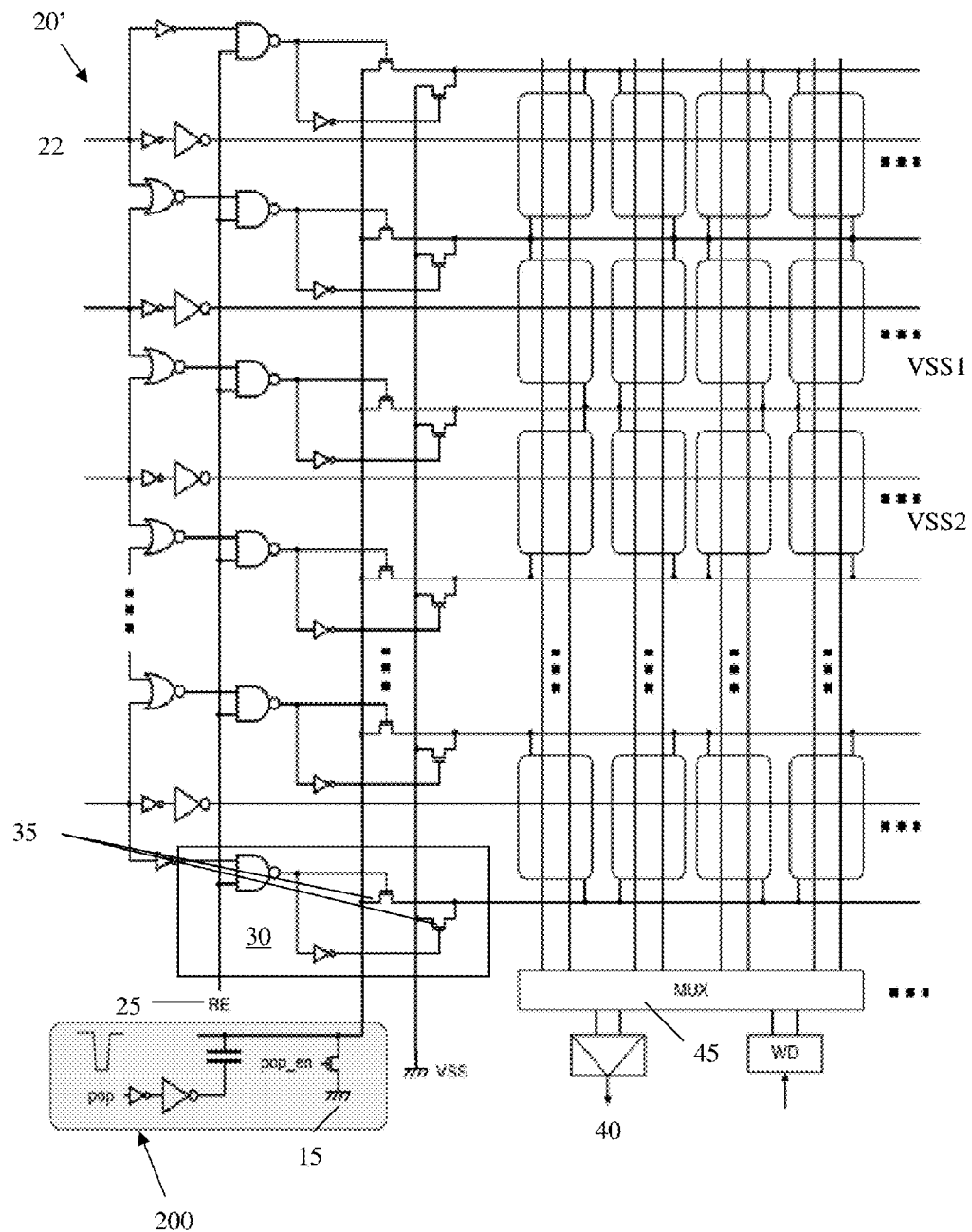
FIG. 7 shows an array of SRAM cells and related circuitry including a charge pump (negative voltage generator) in accordance with aspects of the present disclosure.

FIG. 7 shows an array of SRAM cells and related circuitry including a charge pump (negative voltage generator) in accordance with aspects of the present disclosure. More specifically, in this embodiment, the array of SRAM cells 20' includes an internal negative voltage generator 200 coupled to the cell VSS 15. In embodiments, the internal negative voltage generator 200 is structured to provide a negative voltage to the SRAM cells during a read cycle, upon asserting of a wordline.

Figure 8:
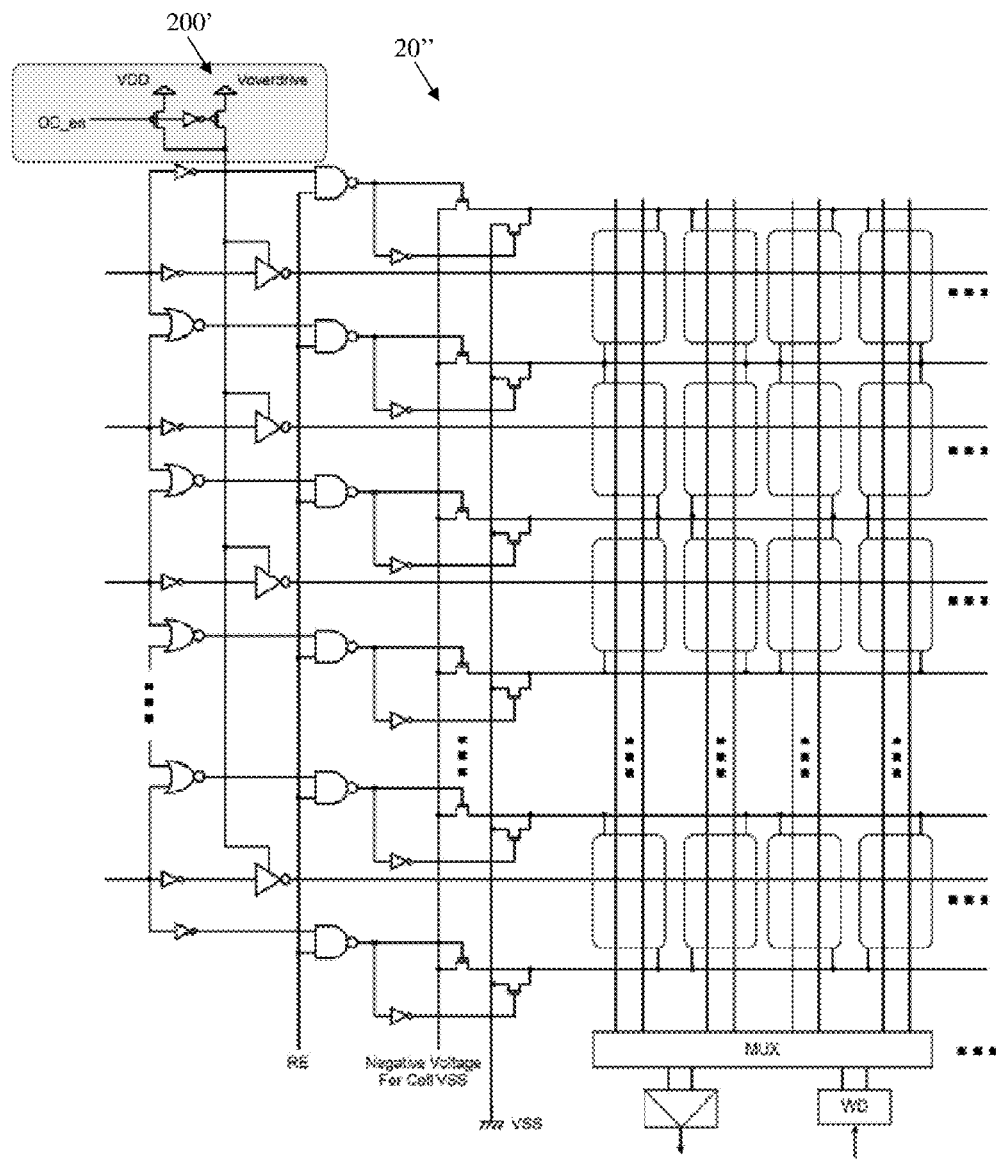
FIG. 8 shows an array of SRAM cells and related circuitry including an overdrive circuit in accordance with aspects of the present disclosure.

FIG. 8 shows an array of SRAM cells and related circuitry including an overdrive circuit in accordance with aspects of the present disclosure. More specifically, the array of SRAM cells 20" includes a conventional override circuit 200' coupled to the wordline WL, in addition to the read assist circuit described herein. In embodiments, the overdrive circuit 200' provides another assist circuit to the SRAM cell. In particular, the overdrive circuit 200' will improve write margin and read speed. Alternatively, the override circuit 200' can also be representative of other assist circuits such as, for example, a write assist or read assist circuit, implemented in combination with the negative voltage scheme described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising at least one static random access memory (SRAM) cell and a read assist circuit structured to apply a negative voltage to the SRAM cell upon asserting of a wordline of the at least one SRAM cell, wherein the negative voltage is asserted synchronously with the wordline of the SRAM cell.

2. The structure of claim 1, wherein the read assist circuit is external to the SRAM cell.

3. The structure of claim 1, wherein the read assist circuit is internal to the SRAM cell.

4. The structure of claim 1, wherein the read assist circuit is a negative voltage generator.

5. The structure of claim 1, further comprising an overdrive circuit coupled to the SRAM cell.

6. The structure of claim 1, wherein the read assist circuit is structured to apply a negative voltage to pull down transistors of the SRAM cell synchronously upon asserting of a wordline.

7. The structure of claim 1, wherein the read assist circuit is structured to apply a negative voltage to pull down transistors of a plurality of SRAM cells in a row of an array of SRAM cells.

8. The structure of claim 7, wherein SRAM cells in other rows of the array are connected to ground.

9. The structure of claim 1, wherein the negative voltage is −0.1 V or −0.2 V.

10. The structure of claim 1, wherein the SRAM cell includes cross couple inverters and the read assist circuit is structured to apply the negative voltage to transistors of the cross couple inverters.

11. The structure of claim 10, further comprising two additional access transistors $M_5$, $M_6$ serving to control access to a storage cell during read and write operations, wherein;

the cross coupled inverters comprise four transistors $M_1$, $M_2$, $M_3$, $M_4$ forming two cross-coupled inverters,
the transistors $M_1$, $M_3$ are pull down transistors;
the access transistors $M_5$, $M_6$ and the pull down transistors $M_1$, $M_3$ are NMOS transistors;
the transistors $M_2$, $M_4$ are PMOS transistors; and
the access transistors $M_5$, $M_6$ are stronger than either the pull down transistors $M_1$, $M_3$ or the transistors $M_2$, $M_4$.

12. The structure of 11, wherein during a read access cycle, synchronously with asserting of the wordline, the read assist circuit will connect to the negative voltage, which is lower than ground.

13. The structure of claim 12, wherein bit lines BL, BLB are actively driven high and low by the cross coupled inverters and the read cycle is started by precharging both bit lines BL and BLB.

14. The structure of claim 13, wherein the precharging both bit lines BL and BLB includes driving the bit lines BL and BLB to a threshold voltage.

15. The structure of claim 14, wherein the threshold voltage is a midrange voltage between logical 1 and 0.

* * * * *